(12) United States Patent
Ni et al.

(10) Patent No.: US 11,676,803 B2
(45) Date of Patent: Jun. 13, 2023

(54) LINER ASSEMBLY FOR VACUUM TREATMENT APPARATUS, AND VACUUM TREATMENT APPARATUS

(71) Applicant: ADVANCED MICRO-FABRICATION EQUIPMENT INC. CHINA, Shanghai (CN)

(72) Inventors: Tuqiang Ni, Shanghai (CN); Rason Zuo, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 137 days.

(21) Appl. No.: 16/895,054

(22) Filed: Jun. 8, 2020

(65) Prior Publication Data

US 2020/0388467 A1 Dec. 10, 2020

(30) Foreign Application Priority Data

Jun. 10, 2019 (CN) .......................... 201910497040.4

(51) Int. Cl.
*H01J 37/32* (2006.01)
*C23C 16/54* (2006.01)

(52) U.S. Cl.
CPC .... *H01J 37/32477* (2013.01); *H01J 37/3244* (2013.01); *C23C 16/54* (2013.01)

(58) Field of Classification Search
None
See application file for complete search history.

(56) References Cited

U.S. PATENT DOCUMENTS

| 6,129,808 | A | * | 10/2000 | Wicker | H01J 37/321 |
| | | | | | 156/914 |
| 6,227,140 | B1 | | 5/2001 | Kennedy et al. | |
| 6,772,827 | B2 | | 8/2004 | Keller et al. | |
| 6,805,952 | B2 | | 10/2004 | Chang et al. | |
| 2011/0287632 | A1 | * | 11/2011 | Brown | B23K 20/122 |
| | | | | | 438/716 |
| 2014/0224174 | A1 | * | 8/2014 | Abedijaberi | H01J 37/32477 |
| | | | | | 138/37 |
| 2014/0272211 | A1 | * | 9/2014 | Nguyen | H01J 37/32477 |
| | | | | | 428/34.1 |
| 2020/0185202 | A1 | * | 6/2020 | Widlow | H01J 37/32642 |

FOREIGN PATENT DOCUMENTS

| KR | 20020047183 A | 6/2002 |
| KR | 20040019109 A | 3/2004 |
| KR | 20080061103 A | 7/2008 |
| KR | 20090037472 A | 4/2009 |

* cited by examiner

*Primary Examiner* — Jason Berman
(74) *Attorney, Agent, or Firm* — Womble Bond Dickinson (US) LLP; Joseph Bach, Esq.

(57) ABSTRACT

Disclosed are a liner assembly for vacuum treatment apparatuses and a vacuum treatment apparatus, wherein the liner assembly for vacuum treatment apparatuses comprises: an annular liner including a sidewall protection ring and a support ring which are interconnected, the outer diameter of the support ring being greater than that of the sidewall protection ring, the annular liner enclosing a treating space; and a gas channel provided in the support ring, the gas channel communicating with the treating space. The liner assembly for vacuum treatment apparatuses offer an improved performance.

24 Claims, 4 Drawing Sheets

LINER ASSEMBLY FOR VACUUM TREATMENT APPARATUS, AND VACUUM TREATMENT APPARATUS

RELATED APPLICATION

The present application claims priority to and the benefit of Chinese Patent Application No. 201910497040.4, filed on 10 Jun. 2019, and the disclosure of which is hereby incorporated by reference in its entirety.

FIELD

Embodiments of the present disclosure generally relate to semiconductors, and more particularly relate to a liner assembly for vacuum treatment apparatuses, and a vacuum treatment apparatus.

BACKGROUND

Fabrication of a semiconductor device involves a variety of semiconductor manufacture equipment, among which is a vacuum treatment apparatus. The vacuum treatment apparatus refers to an apparatus for treating a semiconductor substrate under a vacuum or pressure-relieved condition. Common vacuum treatment apparatuses include a dry etching apparatus or a film formation deposition apparatus. The vacuum treatment apparatus comprises a vacuum chamber and a liner assembly provided on the top surface and partial sidewall of the vacuum chamber. The liner assembly is configured for protecting the inner sidewall of the vacuum chamber from being eroded. After the vacuum treatment apparatus is used for a certain period, the liner assembly becomes unable to satisfy treatment requirements and thus needs to be replaced.

The existing liner assemblies generally have unsatisfactory performances.

SUMMARY

A technical problem to be solved by the present disclosure is provide a liner assembly for vacuum treatment apparatuses, and a vacuum treatment apparatus, so as to enhance performance of the liner assembly for vacuum treatment apparatuses.

To solve the technical problem, the present disclosure provides a liner assembly for vacuum treatment apparatuses, comprising: an annular liner including a sidewall protection ring and a support ring which are interconnected, the outer diameter of the support ring being greater than that of the sidewall protection ring, the annular liner enclosing a treating space; and a gas channel provided in the support ring, the gas channel communicating with the treating space.

Optionally, the gas channel comprises: a gas inlet provided in the support ring; a first gas diffusion cell provided in the support ring, the first gas diffusion cell communicating with the gas inlet; and a gas outlet provided in the support ring, the gas outlet communicating with the first gas diffusion cell and the treating space.

Optionally, when the number of the first gas diffusion cells is 1, the first gas diffusion cell encloses the treating space.

Optionally, when the number of the first gas diffusion cells is more than 1, the distances from respective centers of each of the more than one first gas diffusion cells to the center of the treating space are equal, the more than one first gas diffusion cells being separated from each other, the more than one first gas diffusion cells surrounding the treating space, and each of the more than one first gas diffusion cells communicating with at least one gas inlet and at least one gas outlet.

Optionally, the gas channel further comprises: a second gas diffusion cell provided in the support ring, the second gas diffusion cell enclosing the first gas diffusion cell; and a connection cell communicating the first gas diffusion cell with the second gas diffusion cell.

Optionally, when the number of the second gas diffusion cells is more than 1, the distances from respective centers of each of the more than one second gas diffusion cells to the center of the treating space are equal, the more than one second gas diffusion cells being separate from each other; and the second gas diffusion cells communicating with the gas inlet.

Optionally, the gas channel further comprises: a third gas diffusion cell enclosing the second gas diffusion cell, the third gas diffusion cell communicating with the second gas diffusion cell.

Optionally, the first gas diffusion cell and the second gas diffusion cell are arranged along a first direction; the number of the third gas diffusion cells is more than 1, the more than one third gas diffusion cells being sequentially arranged along the first direction, the third gas diffusion cell, among the more than one third gas diffusion cells, the distance from whose center to the center of the treating space is the furthest, communicating with the gas inlet.

Optionally, the liner assembly for vacuum treatment apparatuses further comprises a coating layer on the interface of the annular liner with respect to the treating space, a material of the coating layer being selected from a group consisting of yttrium oxide, aluminum trioxide, polytetrafluoroethylene or polyimide.

Optionally, the liner assembly for a vacuum treatment apparatus further comprises a heating cell provided in the support ring, the heating cell surrounding the treating space, the heating cell being configured for accommodating a heater for heating the annular liner.

Optionally, the top surface of the support ring exposes the first gas diffusion cell and the heating cell, and the outer sidewall of the support ring exposes the gas inlet.

Optionally, the top surface of the support ring exposes the first gas diffusion cell, and the outer sidewall of the support ring exposes the gas inlet and the heating cell.

Optionally, the liner assembly for vacuum treatment apparatuses further comprises a plasma confinement device connected to the bottom of the sidewall protection ring, the inner diameter of the plasma confinement device being smaller than that of the sidewall protection ring, the plasma confinement device having a plurality of diffusion ports through the plasma confinement device, the diffusion ports communicating with the treating space.

Optionally, the top of the plasma confinement device is integrally formed with the bottom of the sidewall protection ring.

Correspondingly, the present disclosure further provides a vacuum treatment apparatus, comprising: a vacuum reaction chamber enclosed by a vacuum reaction chamber sidewall, the vacuum reaction chamber sidewall including a support face; an annular liner including a sidewall protection ring and a support ring which fixes the sidewall protection ring to the support face, the outer diameter of the support ring being greater than that of the sidewall protection ring, the annular liner enclosing a treating space; a gas channel provided in the support ring, the gas channel communicating with the treating space; a gas inlet unit configured for supplying a reactant gas into the treating space via the gas channel; and a vacuum extracting device configured for maintaining a vacuum environment in the vacuum reaction chamber.

Optionally, the gas channel comprises: a gas inlet provided in the support ring; a first gas diffusion cell provided in the support ring, the first gas diffusion cell communicating with the gas inlet; and a gas outlet provided in the support ring, the gas outlet communicating with the first gas diffusion cell and the treating space.

Optionally, when the number of the first gas diffusion cells is 1, the first gas diffusion cell encloses the treating space.

Optionally, when the number of the first gas diffusion cells is more than 1, the distances from respective centers of each of the more than one first gas diffusion cells to the center of the treating space are equal, the more than one first gas diffusion cells being separated from each other, the more than one first gas diffusion cells surrounding the treating space, and each of the more than one first gas diffusion cells communicating with at least one gas inlet and at least one gas outlet.

Optionally, the gas channel further comprises: a second gas diffusion cell provided in the support ring, the second gas diffusion cell enclosing the first gas diffusion cell; and a connection cell communicating the first gas diffusion cell with the second gas diffusion cell.

Optionally, when the number of the second gas diffusion cells is more than 1, the distances from respective centers of each of the more than one second gas diffusion cells to the center of the treating space are equal, the more than one second gas diffusion cells being separate from each other; and the second gas diffusion cells communicating with the gas inlet.

Optionally, the gas channel further comprises: a third gas diffusion cell enclosing the second gas diffusion cell, the third gas diffusion cell communicating with the second gas diffusion cell.

Optionally, the first gas diffusion cell and the second gas diffusion cell are arranged along a first direction; the number of the third gas diffusion cells is more than 1, the more than one third gas diffusion cells being sequentially arranged along the first direction, the third gas diffusion cell, among the more than one third gas diffusion cells, the distance from whose center to the center of the treating space is the furthest, communicating with the gas inlet.

Optionally, the support ring comprises a first face and a second face which are oppositely provided, the first face being opposite to the support face, and the second face exposing the first gas diffusion cell; sealing members provided inside and outside the first gas diffusion cell; a top cover provided on the vacuum reaction chamber, the sealing members being provided between the top cover and the support ring; an inductive coupling coil provided on the top cover; and a radio frequency power supply connected to the inductive coupling coil.

Optionally, the vacuum treatment apparatus further comprises a heating cell provided in the support ring, the heating cell surrounding the treating space, the second face exposing the heating cell; and a heater provided in the heating cell, the heater being configured for heating the annular liner.

Optionally, the vacuum treatment apparatus further comprises a plasma confinement device connected to the bottom of the sidewall protection ring, the inner diameter of the plasma confinement device being smaller than that of the sidewall protection ring, the plasma confinement device having a plurality of diffusion ports through the plasma confinement device, the diffusion ports communicating with the treating space.

Optionally, the top of the plasma confinement device is integrally formed with the bottom of the sidewall protection ring.

Optionally, the vacuum treatment apparatus further comprises a coating layer on the interface of the annular liner with respect to the treating space, a material of the coating layer being selected from a group consisting of yttrium oxide, aluminum trioxide, polytetrafluoroethylene or polyimide.

Compared with the prior art, the present disclosure offers the following beneficial effects:

In the liner assembly provided by the technical solution of the present disclosure, a gas channel is provided in the support ring, which eliminates the need of additionally providing a gas supply member, as well as the need of providing a sealing member between the gas supply member and the support ring for sealing purposes. As such, the present disclosure facilitates enhancement of the sealing performance of the vacuum treatment apparatus and prevention of gas leakage. Moreover, when the liner assembly for vacuum treatment apparatuses works in a high-temperature or low-pressure environment, even expansion of the sealing member material does not cause gas leakage via the sealing member. In view of the above, the liner assembly for vacuum treatment apparatuses has a relatively low leak rate.

Without the need of additionally providing a gas supply member, it becomes unnecessary to form a corrosion-resistant coating layer on the surface of the gas supply member opposite to the support ring, and as such it becomes unnecessary to worry about the issues of large leak rate and poor corrosion resistance caused by fracturing of the coating layer. In view of the above, the liner assembly for vacuum treatment apparatuses has a relatively low leak rate but a strong corrosion resistance.

Without the need of forming a coating layer which is electrically insulated, there would be interruption for radio frequency transmission. The annular liner material has a relatively strong radio frequency transmission capacity, which reduces radio frequency transmission loss.

Without the need of additionally providing a gas supply member, the liner assembly integrated with the gas channel offers a strong heat transfer capacity.

Moreover, a heating cell is further provided in the support ring, which eliminates the need of additionally providing a heat supply member as well as the need of providing a sealing member between the heat supply member and the support ring for sealing purposes. As such, the present disclosure facilitates enhancement of the sealing performance of the vacuum treatment apparatus and prevention of gas leakage. Moreover, even in a high-temperature or a low-pressure environment, expansion of the sealing member material does not cause gas leakage to the liner assembly for vacuum treatment apparatuses via the sealing member. The heating cell is configured for accommodating a heater for heating the annular liner. In view of the above, the liner assembly for vacuum treatment apparatuses has a relatively low leak rate.

Without the need of additionally providing a heat supply member, it becomes unnecessary to form a corrosion-resistant coating layer on the surface of the heat supply member opposite to the support ring; as such it becomes unnecessary to worry about the issues of large leak rate and poor corrosion resistance caused by fracturing of the coating layer. In view of the above, the liner assembly for vacuum treatment apparatuses has a lower leak rate but a stronger corrosion resistance.

Without the need of forming a coating layer which is electrically insulative, there would be no interruption for radio frequency transmission. The annular liner material has a relatively strong radio frequency transmission capacity, which reduces radio frequency transmission loss to a less extent.

Without the need of additionally providing a heat supply member, the liner assembly integrated with the heating cell offers a strong heat transfer capacity.

Moreover, the liner assembly further comprises: a plasma confinement device connected to the bottom of the sidewall protection ring, wherein the plasma confinement device and the sidewall protection ring are sealed without a sealing member, which facilitates reduction of leak rate and enhancement of corrosion resistance; besides, it offers a good heat transfer effect and a less radio frequency transfer loss.

Further, the gas channel comprises: a gas inlet provided in the support ring; a first gas diffusion cell communicating with the gas inlet; and a gas outlet communicating with the first gas diffusion cell and the treating space. When the number of the first gas diffusion cells is 1, the first gas diffusion cell encloses the treating space, offering a good uniformity for the gas entering the treating space via the gas outlet.

DETAILED DESCRIPTION OF EMBODIMENTS

Figure 1:
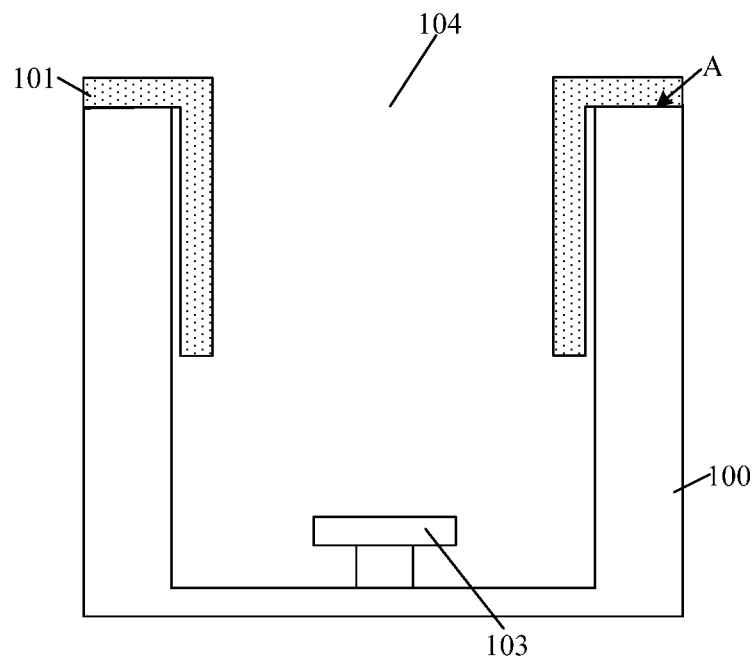
FIG. 1 is a structural schematic diagram of a vacuum treatment apparatus.

As stated in the Background, the conventional liner assemblies for vacuum treatment apparatus have an unsatisfactory performance, as described in details below:

FIG. 1 is a structural schematic diagram of a vacuum treatment apparatus.

Referring to FIG. 1, the vacuum treatment apparatus comprises: a vacuum reaction chamber (not shown in the figure) enclosed by a vacuum reaction chamber sidewall 100, the vacuum reaction chamber sidewall 100 including a support face A; an annular liner 101 including a sidewall protection ring (not shown in the figure) and a support ring (not shown in the figure) which fixes the sidewall protection ring to the support face A, the outer diameter of the support ring being greater than that of the sidewall protection ring, the annular liner 101 enclosing a treating space 104; a base 103 provided at the bottom of the vacuum reaction chamber, the base 103 being provided in the treating space 104, the base 103 being configured for supporting a to-be-treated substrate.

The vacuum treatment apparatus further comprises: a plasma generating unit configured for generating plasma, the plasma being for treating the to-be-treated substrate. During the process of plasma treating of the to-be-treated substrate, the annular liner 101 is configured for protecting the vacuum reaction chamber sidewall 100 so as to prevent the vacuum reaction chamber sidewall 100 from plasma corrosion.

However, development of the semiconductor technology poses a higher requirement on the vacuum treatment device, while the conventional annular liner 101 can hardly satisfy the higher requirement; therefore, it is urgently desired to provide a liner assembly which can satisfy the higher requirement.

To solve the above technical problem, the technical solution of the present disclosure provides a liner assembly for vacuum treatment apparatuses, and a vacuum treatment apparatus, wherein the liner assembly for vacuum treatment apparatuses comprises: an annular liner including a sidewall protection ring and a support ring which are interconnected, the outer diameter of the support ring being greater than that of the sidewall protection ring, the annular liner enclosing a treating space; and a gas channel provided in the support ring, the gas channel communicating with the treating space. The liner assembly for vacuum treatment apparatuses has an improved performance.

To make the above objectives, features, and beneficial effects of the present disclosure, preferred embodiments of the present disclosure will be described in detail with reference to the accompanying drawings.

Figure 2:
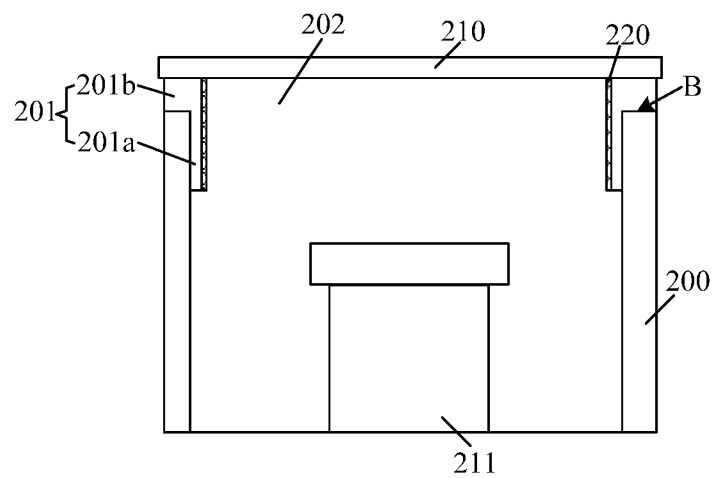
FIG. 2 is a structural schematic diagram of a vacuum treatment apparatus including a liner assembly according to the present disclosure.

FIG. 2 is a structural schematic diagram of a vacuum treatment apparatus including a liner assembly according to the present disclosure.

Referring to FIG. 2, the vacuum treatment apparatus comprises: a vacuum reaction chamber (not shown in the figure) enclosed by a vacuum reaction chamber sidewall 200, the vacuum reaction chamber sidewall 200 including a support face B; an annular liner 201 including a sidewall protection ring 201a and a support ring 201b which fixes the sidewall protection ring 201a to the support face B, the outer diameter of the support ring 201b being greater than that of the sidewall protection ring 201a, the annular liner 201 enclosing a treating space 202; a gas channel (not shown in the figure) provided in the support ring 201b, the gas channel communicating with the treating space 202; a gas inlet unit (not shown in the figure) configured for supplying a reactant gas into the treating space 202 via the gas channel; and a vacuum extracting device (not shown in the figure) configured for maintaining a vacuum environment in the vacuum reaction chamber.

In this embodiment, the vacuum treatment apparatus is a plasma etching apparatus, the vacuum treatment apparatus further comprising a top cover 210 provided on the vacuum reaction chamber; and a plasma generating unit (not shown in the figure) configured for deionizing the reactant gas into plasma.

The plasma generating unit comprises an inductive coil (not shown in the figure) provided on the top cover 210; and a radio frequency power supply connected to the inductive coil.

The reactant gas includes a corrosive gas that may have a chemical reaction with the substrate materials of the vacuum reaction chamber sidewall 200 and the annular liner 201.

In this embodiment, the substrate materials of the vacuum reaction chamber sidewall 200 and the annular liner 201 both include aluminum; and the reactant gas includes a halogen gas. The halogen gas is susceptible to chemical reaction with aluminum; in order to prevent the vacuum reaction chamber sidewall 200 and the annular liner 201 from being corroded by the halogen gas, a coating layer is formed on the interfaces of the vacuum reaction chamber sidewall 200 and the annular liner 201 with respect to the treating space 202.

Limited by practical processes, fracturing of the coating layer is inevitable. Moreover, the fracturing easily develops under a high-temperature or low-pressure environment.

In this embodiment, a material of the coating is polytetrafluoroethylene. Polytetrafluoroethylene is less volatile, such that the quality of the coating layer does not change with time, the coating's protection capacity over the annular liner 201 is not limited by time, and the liner assembly is not easily corroded in a long term. Additionally, polytetrafluoroethylene has no absorbability and is not easily flaky, such that the coating layer does not easily cause additional contaminations to the sealing device; besides, polytetrafluoroethylene has a strong corrosion resistance, such that corrosive ions do not easily penetrate through the coating layer to access the annular liner 201, which reduces damages to the annular liner 201.

In other embodiments, a material of the coating layer includes yttrium oxide, aluminum trioxide or polyimide.

The vacuum treatment device further comprises: a base 211 provided in the treating space 202, the base 211 being provided at the bottom of the vacuum reaction chamber.

The base 211 is configured for supporting the to-be-treated substrate, and the plasma is configured for treating the to-be-treated substrate.

The liner assembly comprises: an annular liner 201 and a gas channel, which will be described in detail below.

Figure 3:
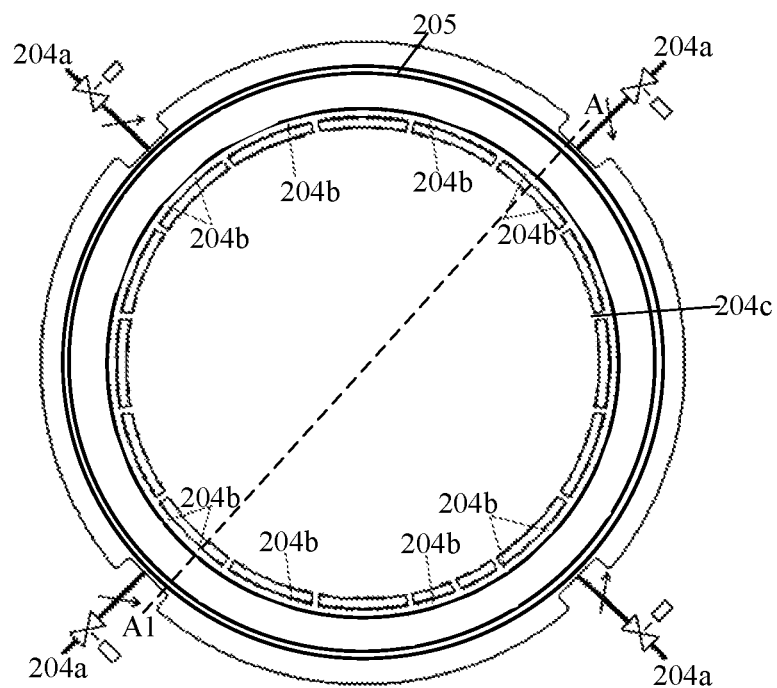
FIG. 3 is a structural schematic diagram of a liner assembly for vacuum treatment apparatuses according to the present disclosure.
Figure 4:
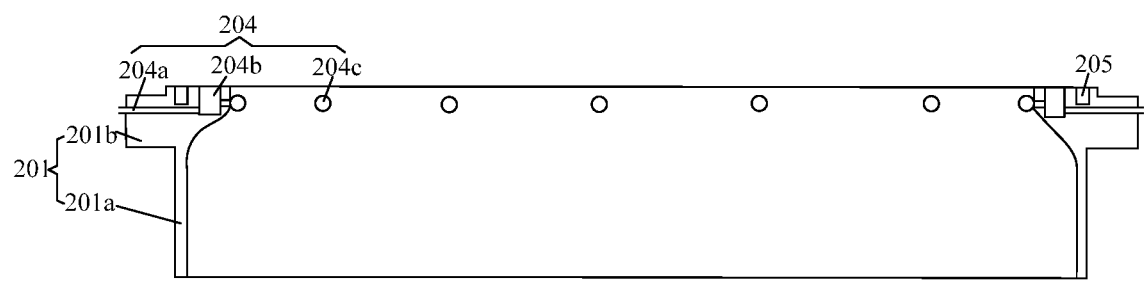
FIG. 4 is a sectional structural schematic diagram of FIG. 3 along line A-A1.

FIG. 3 is a structural schematic diagram of a liner assembly for vacuum treatment apparatuses according to the present disclosure; and FIG. 4 is a sectional structural schematic diagram of FIG. 3 along line A-A1.

Referring to FIG. 3 and FIG. 4, the liner assembly for vacuum treatment apparatuses comprises: an annular liner 201 including a sidewall protection ring 201a and a support ring 201b, the outer diameter of the support ring 201b being greater than that of the sidewall protection ring 201a, the annular liner 201 enclosing a treating space 202; and a gas channel 204 provided in the support ring 201b, the gas channel 204 communicating with the treating space 202.

Because the gas channel 204 is provided in the support ring 201b, which eliminates the need of additionally providing a gas supply member, such that it also becomes unnecessary to provide a sealing member between the gas supply member and the support ring 201b for sealing purposes. As such, sealing performance of the vacuum treatment apparatus is enhanced and gas leakage is prevented. Moreover, even in a high-temperature or low-pressure environment, expansion of the sealing member material does not cause gas leakage of the liner assembly for vacuum treatment apparatuses via the sealing member, and fracturing of the coating layer does not cause increase of the leak rate. In view of the above, the liner assembly for vacuum treatment apparatuses has a relatively low leak rate.

Further, without the need of additionally providing a gas supply member, it becomes unnecessary to form a corrosion-resistant coating layer on the surface of the gas supply member opposite to the support ring 201b, such that it becomes unnecessary to worry about the issues of large leak rate and poor corrosion resistance caused by fracturing of the coating layer. In view of the above, the liner assembly for vacuum treatment apparatuses has a lower leak rate but a stronger corrosion resistance.

Moreover, without the need of forming a coating layer which is electrically insulative, there would be no interruption for radio frequency transmission. The annular liner material has a relatively strong radio frequency transmission capacity, which reduces radio frequency transmission loss.

Moreover, without the need of additionally providing a gas supply member, the one-component liner assembly with the gas channel 204 offers a strong heat transfer capacity.

The gas channel 204 comprises: a gas inlet 204a provided in the support ring 201b; a first gas diffusion cell 204b provided in the support ring 201b, the first gas diffusion cell 204b communicating with the gas inlet 204a; and a gas outlet 204c provided in the support ring 201b, the gas outlet 204c communicating with the first gas diffusion cell 204b and the treating space 202.

In this embodiment, when the number of the first gas diffusion cells 204b is 1, the first gas diffusion cell 204b surrounding the treating space 202; when the number of the gas outlet ports 204c is greater than 1, a plurality of outlet ports 204c are uniformly distributed about the treating space 202, offering a good uniformity for the gas entering the treating space 202.

In this embodiment, the liner assembly for vacuum treatment apparatuses further comprises: sealing members (not shown) inside and outside of the first gas diffusion cell 204b, the sealing members being provided between the top cover 210 and the support ring 201b.

In this embodiment, the liner assembly further comprises: a heating cell 205 provided in the support ring 201b, the heating cell 205 surrounding the treating space 202, the heating cell 205 being configured for disposing a heater for heating the annular liner 201, which facilitates enhancement of uniform diffusion of the gas in the first gas diffusion cell 204b so as to prevent gas deposition.

Because the heating cell 205 is further provided in the support ring 201b, which eliminates the need of additionally providing a gas supply member as well as the need of providing a sealing member between the gas supply member and the support ring 201 for implementing sealing. As such, the sealing performance of the vacuum treatment apparatus is enhanced and gas leakage is prevented. Moreover, even in a high-temperature or low-pressure environment, expansion of the sealing member material does not cause gas leakage of the liner assembly for vacuum treatment apparatuses via the sealing member, and fracturing of the coating layer does not cause increase of the leak rate. The heating cell 205 is configured for accommodating a heater t for heating the annular liner. In view of the above, the liner assembly for vacuum treatment apparatuses has a lower leak rate.

Without the need of additionally providing a heat supply member, it becomes unnecessary to form a corrosion-resistant coating on the surface of the heat supply member opposite to the support ring 201, and thus it becomes unnecessary to worry about the issues of large leak rate and poor corrosion resistance caused by fracturing of the coating layer. In view of the above, the liner assembly for vacuum treatment apparatuses has a lower leak rate and a stronger corrosion resistance.

Without the need of forming a coating layer which is electrically insulative, there would be no interruption for radio frequency transmission. The annular liner material has a stronger radio frequency transmission capacity and a less radio frequency transmission loss.

Without the need of additionally providing a heat supply member, the one component liner assembly with the heating cell 205 offers a stronger heat transfer capacity.

In this embodiment, the support ring 201*b* comprises a first face (not shown in the figure) and a second face (not shown in the figure) which are oppositely provided, the first face being opposite to the support face B, the second face exposing the first gas diffusion cell 204*b* and the heating cell 205; the outer sidewall of the support ring 201*b* exposing the gas inlet 204*a*.

In other embodiments, the second face exposes the first gas diffusion cell; and the outer sidewall of the support ring exposes the inlet port and the heating cell.

The heater is configured for heating the annular liner 201, which facilitates reduction of the subsequent temperature difference between different to-be-treated substrates in the treating space 220.

In this embodiment, the heater is a heating filament. In other embodiments, the heater may also be another kind of heating device.

In other embodiments, the liner does not have a heating cell.

In this embodiment, the liner assembly further comprises: a plasma confinement device (not shown in the figure) connected to the bottom of the liner 200.

The inner diameter of the plasma confinement device is smaller than that of the sidewall protection ring 201*a*, the plasma confinement device having a diffusion port through the plasma confinement device. The diffusion port is configured for outputting plasma.

Figure 5:
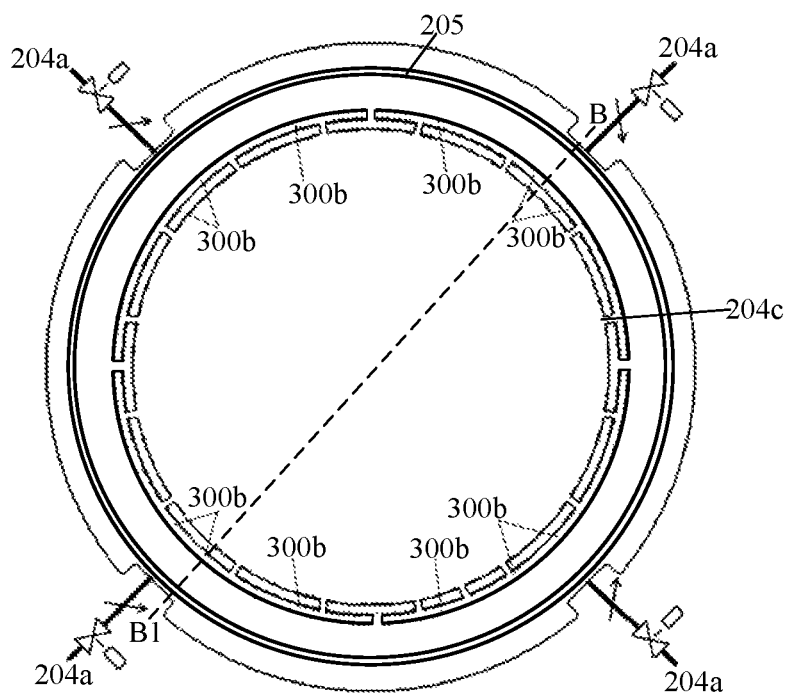
FIG. 5 is a structural schematic diagram of another liner assembly for vacuum treatment apparatuses according to the present disclosure.
Figure 6:
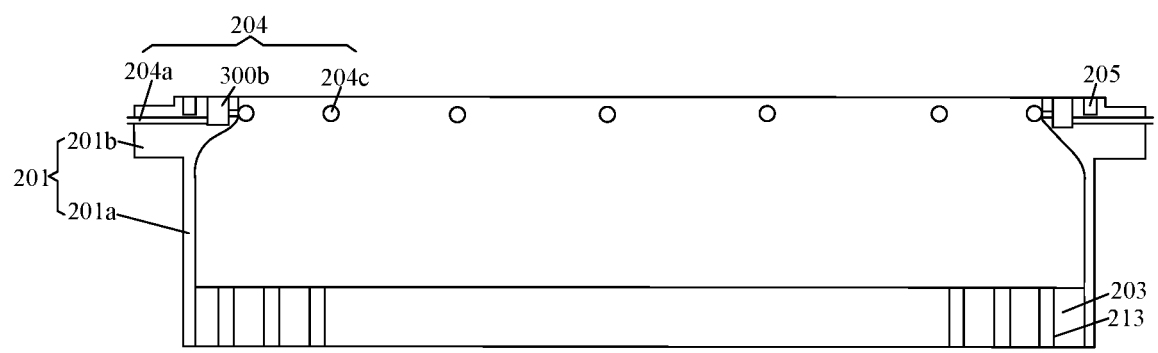
FIG. 6 is a sectional structural schematic diagram of FIG. 5 along line B-B1.

FIG. 5 is a structural schematic diagram of another liner assembly for vacuum treatment apparatuses according to the present disclosure; FIG. 6 is a sectional structural schematic diagram of FIG. 5 along line B-B1.

This embodiment differs from the aforementioned embodiment in that the number of the first gas diffusion cells 300*b* is more than 1, the distances from respective centers of each of the more than one first gas diffusion cells 300*b* to the center of the treating space 202 are equal, a plurality of the first gas diffusion cells 300*b* being separated from each other, the more than one first gas diffusion cells 300*b* being arranged about the treating space 202, and each of the first gas diffusion cells 300*b* communicating with at least one gas inlet 204*a* and at least one gas outlet 204*c*, such that each of the first gas diffusion cells 300*b* can be separately controlled and is immune from the influence of other first gas diffusion cells 300*b*.

This embodiment differs from the aforementioned embodiment further in that: the bottom of the sidewall protection ring 201*a* is integrally formed with the top of the plasma confinement device 203, such that the plasma confinement device 203 and the sidewall protection ring 201*a* are sealed without additionally providing a sealing member for sealing purposes, which facilitates enhancement of corrosion resistance and reduction of leak rate; besides, it offers an improved heat transfer effect and a less radio frequency transfer loss.

In other embodiments, the annular liner and the plasma confinement device are separately formed, and the sidewall protection ring and the plasma confinement device are sealed therebetween by a sealing member.

Figure 7:
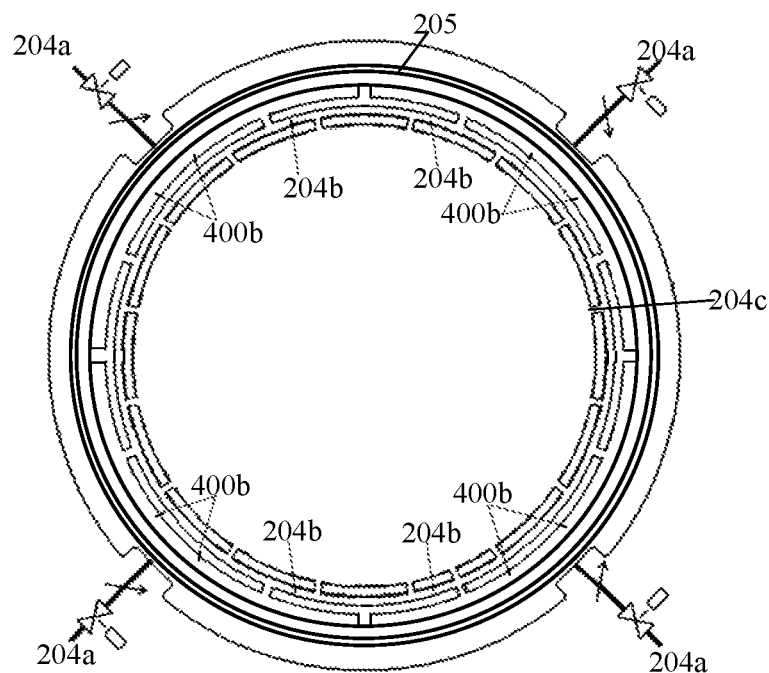
FIG. 7 is a structural schematic diagram of a further liner assembly for vacuum treatment apparatuses according to the present disclosure.

FIG. 7 is a structural schematic diagram of a further liner assembly for vacuum treatment apparatuses according to the present disclosure.

This embodiment differs from that illustrated in FIG. 4 in that the gas channel further comprises: a second gas diffusion cell 400*b* provided in the support ring 201*b*, the second gas diffusion cell 400*b* enclosing the first gas diffusion cell 204*b*; and a connection cell communicating with the first gas diffusion cell 204*b* and the second gas diffusion cell 400*b*.

In this embodiment, the number of the second gas diffusion cells 400*b* is more than 1, the distances from respective centers of each of the more than one gas diffusion cells 400*b* to the center of the treating space 202 are equal, the more than one second gas diffusion cells 400*b* being separate from each other; and the second gas diffusion cells 400*b* communicating with the gas inlet 204*a*. Because the more than one second gas diffusion cells 400*b* are separate from each other, respective second gas diffusion cells 400*b* do not interfere with each other. The reactant gas flowing through the second gas diffusion cell 400*b* enters the first gas diffusion cell 204*b*, which facilitates uniform mixture of the reactant gas, facilitates enhancement of distribution density of the subsequent plasma, and improves uniformity of the to-be-treated substrate.

Figure 8:
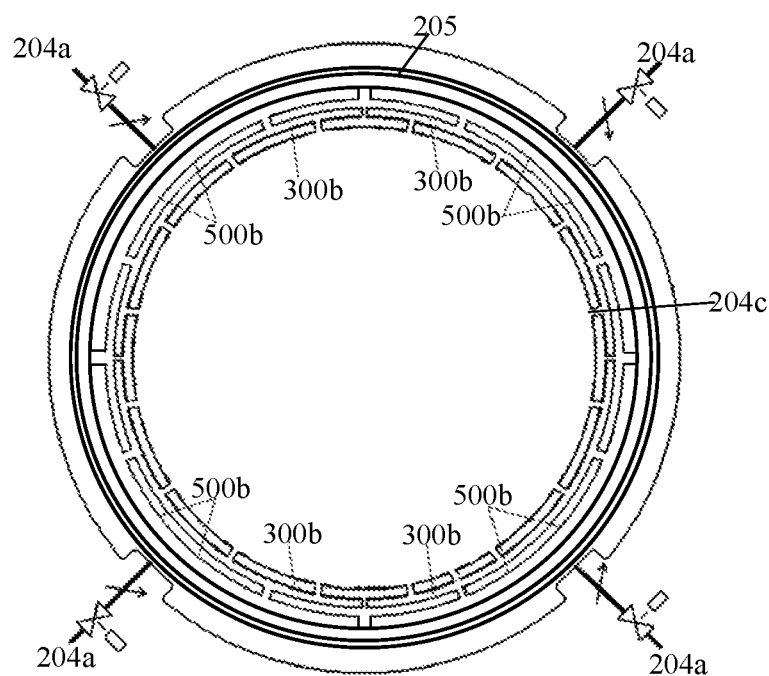
FIG. 8 is a structural schematic diagram of a still further liner assembly for vacuum treatment apparatuses according to the present disclosure.

FIG. 8 is a structural schematic diagram of a still further liner assembly for vacuum treatment apparatuses according to the present disclosure.

This embodiment differs from that illustrated in FIG. 5 only in that: the gas channel 204 further comprises: a second gas diffusion cell 500*b* provided in the support ring 201*b*, the second gas diffusion cell 500*b* enclosing the first gas diffusion cell 300*b*; and a connection cell communicating the first gas diffusion cell 300*b* with the second gas diffusion cell 500*b*.

In this embodiment, the number of the second gas diffusion cells 500*b* is more than 1, the distances from respective centers of each of the more than one gas diffusion cells 500*b* to the center of the treating space 202 are equal, the more than one second gas diffusion cells 500*b* being separate from each other; and the second gas diffusion cells 500*b* communicating with the gas inlet 204*a*.

In this embodiment, the gas channel only comprises a gas inlet 204*a*, a second gas diffusion cell 500*b*, a first gas diffusion cell 300*b*, and an outlet port 204*c*.

In other embodiments, the gas channel further comprises: a third gas diffusion cell enclosing the second gas diffusion cell, the third gas diffusion cell communicating with the second gas diffusion cell; the first gas diffusion cell and the second gas diffusion cell are arranged along a first direction; the number of the third gas diffusion cells is more than 1, the more than one third gas diffusion cells being sequentially arranged along the first direction, the third gas diffusion cell, among the more than one third gas diffusion cells, the distance from whose center to the center of the treating space is the furthest, communicating with the gas inlet.

Although the present disclosure has been described above, the present disclosure is not limited thereto. Any person skilled in the art may make various changes and modifications without departing from the spirit and scope of the present disclosure; therefore, the protection scope of the present disclosure should accord with the scope defined by the appended claims.

We claim:

1. A liner assembly for vacuum treatment apparatuses, comprising:
   an annular liner including a sidewall protection ring and a support ring which are interconnected, the outer diameter of the support ring being greater than that of the sidewall protection ring, the annular liner enclosing a treating space; and a gas channel provided in the support ring, the gas channel including more than one first gas diffusion cells surrounding the treating space and communicating with the treating space;

wherein the distances from respective centers of each of the more than one first gas diffusion cells to the center of the treating space are equal, the more than one first gas diffusion cells being separated from each other, the more than one first gas diffusion cells surrounding the treating space, and each of the more than one first gas diffusion cells communicating with at least one gas inlet and at least one gas outlet.

2. The liner assembly for vacuum treatment apparatuses according to claim 1, wherein the gas channel comprises: a gas inlet provided in the support ring; the first gas diffusion cell communicating with the gas inlet; and a gas outlet provided in the support ring, the gas outlet communicating with the first gas diffusion cell and the treating space.

3. The liner assembly for vacuum treatment apparatuses according to claim 2, wherein when the number of the first gas diffusion cells is 1, the first gas diffusion cell encloses the treating space.

4. The liner assembly for vacuum treatment apparatuses according to claim 3, wherein the gas channel further comprises: a second gas diffusion cell provided in the support ring, the second gas diffusion cell enclosing the first gas diffusion cell; and a connection cell communicating the first gas diffusion cell with the second gas diffusion cell.

5. The liner assembly for vacuum treatment apparatuses according to claim 4, wherein when the number of the second gas diffusion cells is more than 1, the distances from respective centers of each of the more than one second gas diffusion cells to the center of the treating space are equal, the more than one second gas diffusion cells being separate from each other; and the second gas diffusion cells communicating with the gas inlet.

6. The liner assembly for vacuum treatment apparatuses according to claim 5, wherein the gas channel further comprises: a third gas diffusion cell enclosing the second gas diffusion cell, the third gas diffusion cell communicating with the second gas diffusion cell.

7. The liner assembly for vacuum treatment apparatuses according to claim 6, wherein the first gas diffusion cell and the second gas diffusion cell are arranged along a first direction; the number of the third gas diffusion cells is more than 1, the more than one third gas diffusion cells being sequentially arranged along the first direction, the third gas diffusion cell, among the more than one third gas diffusion cells, the distance from whose center to the center of the treating space is the furthest, communicating with the gas inlet.

8. The liner assembly for vacuum treatment apparatuses according to claim 1, further comprising a coating layer on the interface of the annular liner with respect to the treating space, a material of the coating layer being selected from a group consisting of yttrium oxide, aluminum trioxide, polytetrafluoroethylene or polyimide.

9. The liner assembly for vacuum treatment apparatuses according to claim 2, further comprising a heating cell provided in the support ring, the heating cell surrounding the treating space, the heating cell being configured for accommodating a heater for heating the annular liner.

10. The liner assembly for vacuum treatment apparatuses according to claim 9, wherein the top surface of the support ring exposes the first gas diffusion cell and the heating cell, and the outer sidewall of the support ring exposes the gas inlet.

11. The liner assembly for vacuum treatment apparatuses according to claim 9, wherein the top surface of the support ring exposes the first gas diffusion cell; and the outer sidewall of the support ring exposes the gas inlet and the heating cell.

12. The liner assembly for vacuum treatment apparatuses according to claim 1, further comprising a plasma confinement device connected to the bottom of the sidewall protection ring, the inner diameter of the plasma confinement device being smaller than that of the sidewall protection ring, the plasma confinement device having a plurality of diffusion ports through the plasma confinement device, the diffusion ports communicating with the treating space.

13. The liner assembly for vacuum treatment apparatuses according to claim 12, wherein the top of the plasma confinement device is integrally formed with the bottom of the sidewall protection ring.

14. A vacuum treatment apparatus, comprising:
a vacuum reaction chamber enclosed by a vacuum reaction chamber sidewall, the vacuum reaction chamber sidewall including a support face;
an annular liner including a sidewall protection ring and a support ring which fixes the sidewall protection ring to the support face, the outer diameter of the support ring being greater than that of the sidewall protection ring, the annular liner enclosing a treating space;
a gas channel provided in the support ring, the gas channel including more than one first gas diffusion cells surrounding the treating space and communicating with the treating space;
a gas inlet unit configured for supplying a reactant gas into the treating space via the gas channel; and
a vacuum extracting device configured for maintaining a vacuum environment in the vacuum reaction chamber;
wherein the distances from respective centers of each of the more than one first gas diffusion cells to the center of the treating space are equal, the more than one first gas diffusion cells being separated from each other, the more than one first gas diffusion cells surrounding the treating space, and each of the more than one first gas diffusion cells communicating with at least one gas inlet and at least one gas outlet.

15. The vacuum treatment apparatus according to claim 14, herein the gas channel comprises: a gas inlet provided in the support ring the first gas diffusion cell communicating with the gas inlet; and a gas outlet provided in the support ring, the gas outlet communicating with the first gas diffusion cell and the treating space.

16. The vacuum treatment apparatus according to claim 15, wherein when the number of the first gas diffusion cells is 1, the first gas diffusion cell encloses the treating space.

17. The vacuum treatment apparatus according to claim 16, wherein the gas channel further comprises: a second gas diffusion cell provided in the support ring, the second gas diffusion cell enclosing the first gas diffusion cell; and a link cell communicating the first gas diffusion cell with the second gas diffusion cell.

18. The vacuum treatment apparatus according to claim 17, wherein when the number of the second gas diffusion cells is more than 1, the distances from respective centers of each of the more than one second gas diffusion cells to the center of the treating space are equal, the more than one second gas diffusion cells being separate from each other; and the second gas diffusion cells communicating with the gas inlet.

19. The vacuum treatment apparatus according to claim 18, wherein the gas channel further comprises: a third gas diffusion cell enclosing the second gas diffusion cell, the third gas diffusion cell communicating with the second gas diffusion cell.

20. The vacuum treatment apparatus according to claim 19, wherein the first gas diffusion cell and the second gas diffusion cell are arranged along a first direction; the number of the third gas diffusion cells is more than 1, the more than one third gas diffusion cells being sequentially arranged along the first direction, the third gas diffusion cell, among the more than one third gas diffusion cells, the distance from whose center to the center of the treating space is the furthest, communicating with the gas inlet.

21. The vacuum treatment apparatus according to claim 15, wherein the support ring comprises a first face and a second face which are oppositely provided, the first face being opposite to the support face, and the second face exposing the first gas diffusion cell; sealing members provided inside and outside the first gas diffusion cell; a top cover provided on the vacuum reaction chamber, the sealing members being provided between the top cover and the support ring; an inductive coupling coil provided on the top cover; and a radio frequency power supply connected to the inductive coupling coil.

22. The vacuum treatment apparatus according to claim 21, further comprising: a heating cell provided in the support ring, the heating cell surrounding the treating space, the second face exposing the heating cell; and a heater provided in the heating cell, the heater being configured for heating the annular liner.

23. The vacuum treatment apparatus according to claim 14, further comprising a plasma confinement device connected to the bottom of the sidewall protection ring, the inner diameter of the plasma confinement device being smaller than that of the sidewall protection ring, the plasma confinement device having a plurality of diffusion ports through the plasma confinement device, the diffusion ports communicating with the treating space.

24. The vacuum treatment apparatus according to claim 14, further comprising a coating layer on the interface of the annular liner with respect to the treating space, a material of the coating layer being selected from a group consisting of yttrium oxide, aluminum trioxide, polytetrafluoroethylene or polyimide.

* * * * *